(12) United States Patent
Lee et al.

(10) Patent No.: US 6,392,886 B1
(45) Date of Patent: May 21, 2002

(54) HEAT SINK ASSEMBLY

(75) Inventors: Hsieh Kun Lee, Taipei (TW); Wellint Xia, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/853,982

(22) Filed: May 11, 2001

(30) Foreign Application Priority Data

Mar. 20, 2001 (TW) .......................................... 90204165

(51) Int. Cl.⁷ ................................................ H05K 7/20

(52) U.S. Cl. .......................... 361/703; 24/458; 174/16.3; 165/185

(58) Field of Search ................................... 267/150, 158, 267/160; 174/16.3; 248/316.7, 505, 510; 257/718, 719, 722, 726, 727; 165/80.3, 185; 361/687, 703, 704, 709–712, 717–719; 24/453, 457, 458, 625, 459

(56) References Cited

U.S. PATENT DOCUMENTS

| | | | |
|---|---|---|---|
| 5,386,338 A | * | 1/1995 | Jordan et al. ................ 361/704 |
| 5,889,653 A | * | 3/1999 | Clemens et al. ............. 361/704 |
| 6,295,203 B1 | * | 9/2001 | Lo .............................. 361/704 |
| 6,311,765 B1 | * | 11/2001 | Lo et al. ..................... 165/80.3 |

* cited by examiner

Primary Examiner—Gerald Tolin
(74) Attorney, Agent, or Firm—Wei Te Chung

(57) ABSTRACT

A heat sink assembly includes a heat sink (30), a clip (20), and a fastener (10). The heat sink has a base (301) and a plurality of parallel fins (302) extending therefrom. A pair of barbs (303) is symmetrically formed on outmost sides of two adjacent central fins. The fastener includes a basal body (101), a pair of side arms (103) extending upwardly from the body, a pair of pressing plates (104) extending horizontally outwardly from top ends of the side arms, a pair of locking arms (105) depending from the pressing plates, and a pair of catches (106) inwardly formed at distal ends of the locking arms for engaging with the barbs of the heat sink. A notch (102) is defined in a bottom of the body, for facilitating the fastener abutting against a pressing section (201) of the clip.

15 Claims, 5 Drawing Sheets

HEAT SINK ASSEMBLY

BACKGROUND OF THE INVENTION

1. Field of the Invention

The present invention relates to a heat sink assembly, and particularly to a heat sink assembly incorporating a fastener and a clip.

2. Related Art

Advances in microelectronics technology have resulted in electronic devices which process signals and data at unprecedented high speeds. During operation of many contemporary electronic devices such as CPUs, large amounts of heat are produced. The heat must be efficiently removed, to prevent the system from becoming unstable or being damaged.

Typically, a heat sink assembly comprises a heat sink, a fan and a clip attached to an outer surface of the electronic device to facilitate removal of heat therefrom. The clip in this kind of assembly is a discrete part which must be packed and transported separately. The clip takes up additional transportation space. Furthermore, in use, the clip is prone to be displaced or to fall away from the heat sink. Thus the clip does not always firmly attach the heat sink to the electronic device, thereby lowering the efficiency of heat removal.

To overcome the above-mentioned problems, a spring metal clamp is commonly used to fasten the clip to the heat sink prior to transportation. This kind of spring metal clamp is not easily made, and requires a special apparatus to complete assembly. Thus the manufacturing and assembly processes are unduly complicated and costly.

An improved heat sink assembly, which overcomes the above problems, is desired.

BRIEF SUMMARY OF THE INVENTION

Accordingly, an object of the present invention is to provide a heat sink assembly which is conveniently assembled prior to transportation.

Another object of the present invention is to provide a heat sink assembly which can be securely attached to an electronic device.

A further object of the present invention is to provide a heat sink assembly which has low costs.

To achieve the above-mentioned objects, a heat sink assembly of the present invention comprises a heat sink, a clip and a fastener. The heat sink has a base and a plurality of parallel fins extending therefrom. A pair of barbs is symmetrically formed on outmost sides of two adjacent central fins. The fastener comprises a basal body, a pair of side arms extending upwardly from the body, a pair of pressing plates extending horizontally outwardly from top ends of the side arms, a pair of locking arms depending from the pressing plates, and a pair of catches inwardly formed at distal ends of the locking arms for engaging with the barbs of the heat sink. A notch is defined in a bottom of the body, for facilitating the fastener abutting against a pressing section of the clip.

Other objects, advantages and novel features of the present invention will be drawn from the following detailed description of preferred embodiments of the present invention together with the attached drawings, in which:

DESCRIPTION OF THE PREFERRED EMBODIMENTS

Figure 1:
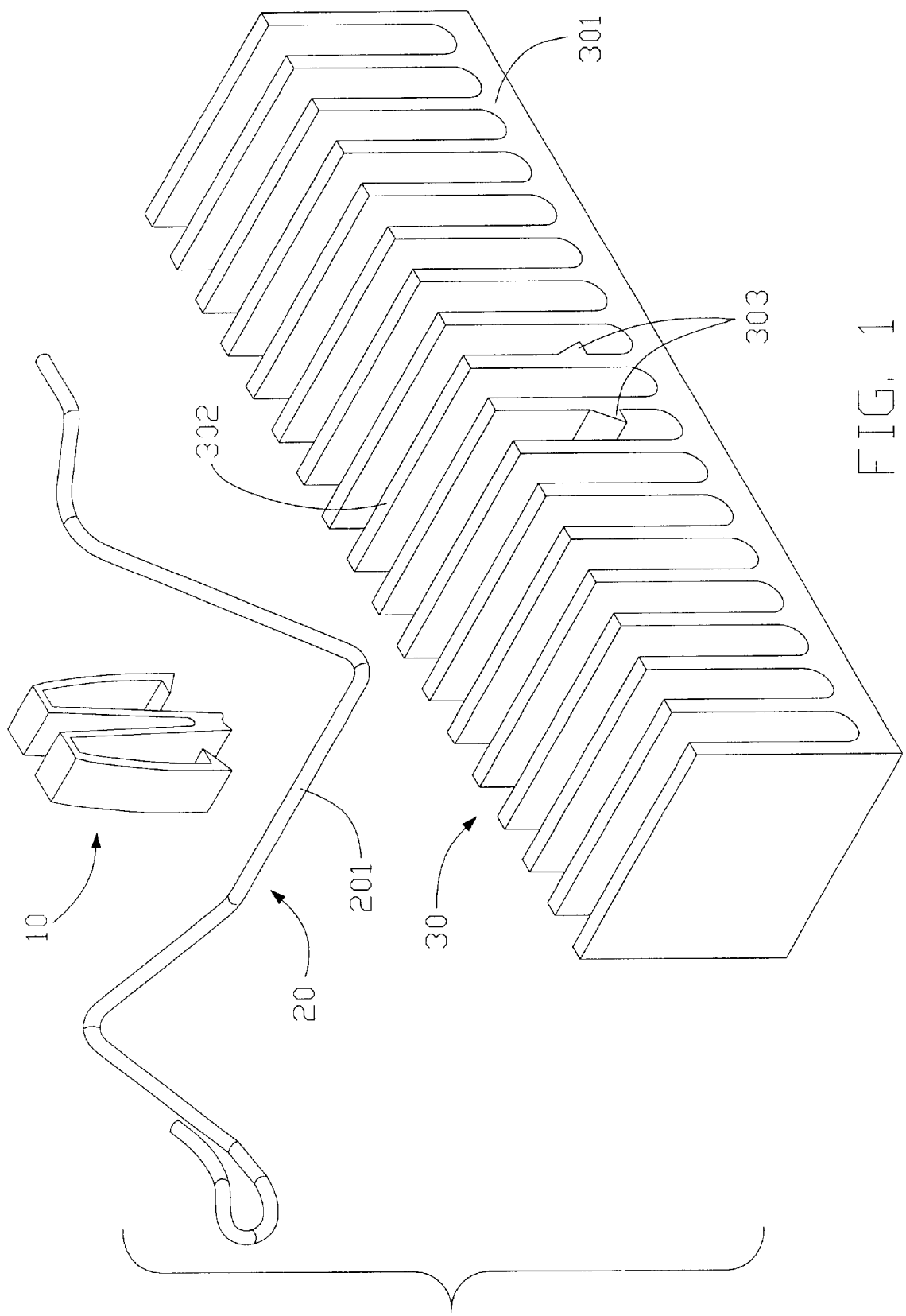
FIG. 1 is an exploded view of a heat sink assembly in accordance with a preferred embodiment of the present invention.

Referring to FIG. 1, a heat sink assembly in accordance with the present invention comprises a heat sink 30, a clip 20, and a fastener 10 which fastens the clip 20 to the heat sink 30. The heat sink 30 comprises a base 301 and a plurality of parallel fins 302 extending upwardly therefrom. A pair of barbs 303 is formed on respective outmost sides of two adjacent central fins 302. The barbs 303 are respectively positioned at lower portions of the said central fins 302. The clip 20 can be made of any spring material, such as hardened spring steel wire. A cross section of the clip 20 is circular. The clip 20 comprises a horizontal pressing section 201 for pressing the heat sink 30 onto an electronic device (not shown).

Figure 2:
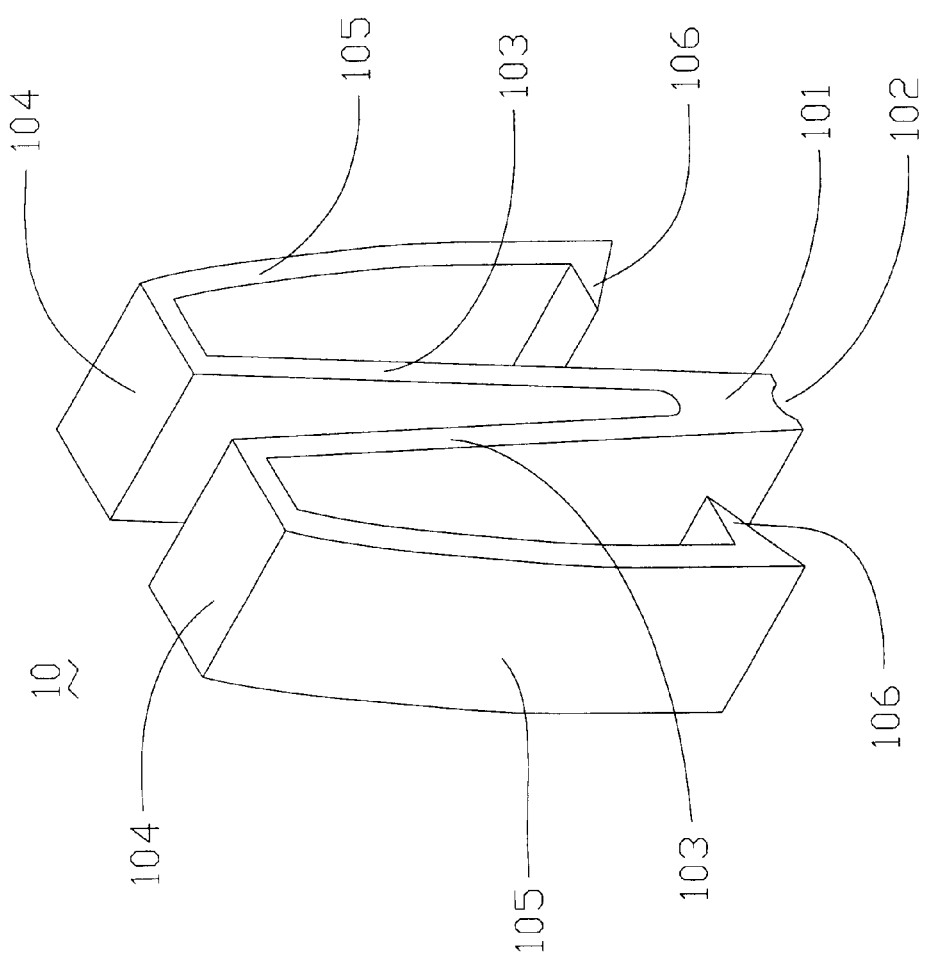
FIG. 2 is a perspective view of a fastener of FIG. 1.

Referring also to FIG. 2, the fastener 10 is integrally made of plastic material. The fastener 10 has a basal body 101 and a pair of side arms 103 extending upwardly and slightly outwardly therefrom. The side arms 103 extend a distance corresponding to a height of the fins 302 of the heat sink 30. A pressing plate 104 extends horizontally outwardly from a top end of each side arm 103. A width of each pressing plate 104 is approximately equal to a thickness of each fin 302. An arc-shaped locking arm 105 depends from an outer end of each pressing portion 104. A catch 106 extends inwardly from a free end of each locking arm 105, for engaging with the corresponding barbs 303 of the heat sink 30. An arc-shaped notch 102 is defined in a bottom surface of the basal body 101, for facilitating abutting of the pressing section 201 of the clip 20 against the base 301 of the heat sink 30.

Figure 3:
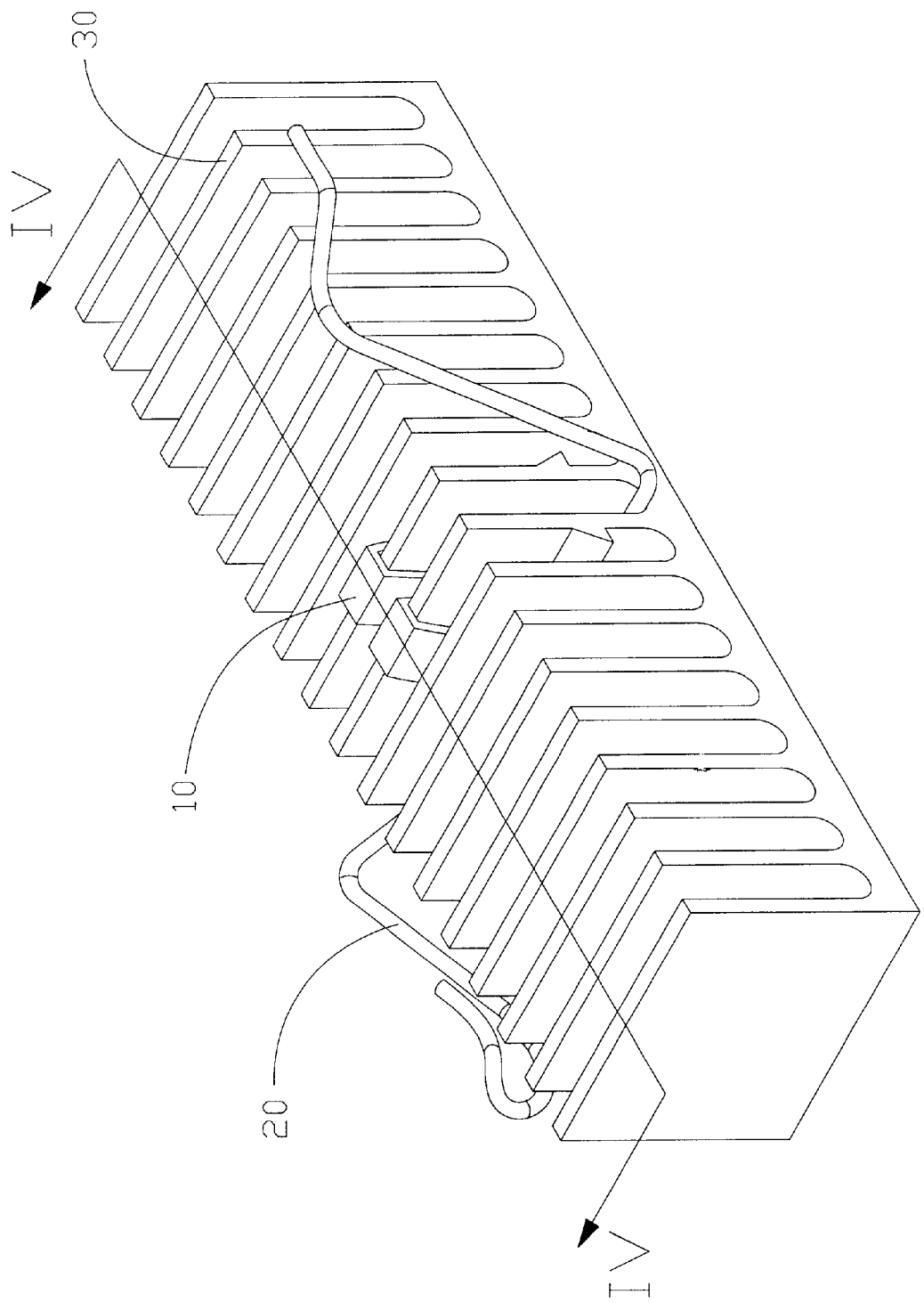
FIG. 3 is an assembled view of FIG. 1.
Figure 4:
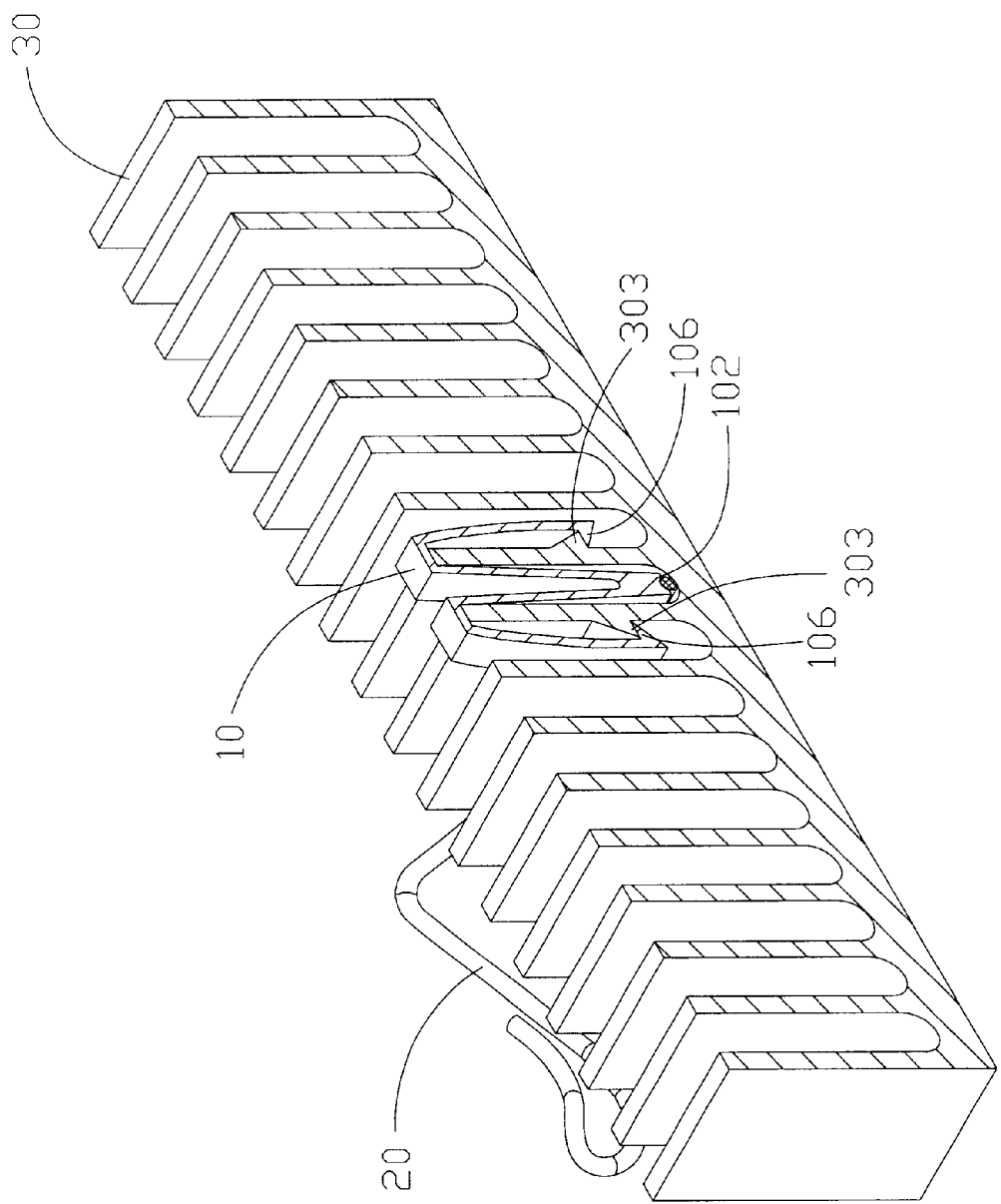
FIG. 4 is a cross sectional view of FIG. 3, taken along line IV—IV.

Referring also to FIGS. 3 and 4, in assembly, the pressing section 201 of the clip 20 is placed in a space (not labeled) of the heat sink 30 between the two central fins 302 having the barbs 303. The basal body 101 and the side plates 103 of the fastener 10 are pressed downwardly into the said space, until the catches 106 of the fastener 10 snappingly engage with the barbs 303 of the heat sink 30. The arc-shaped notch 102 of the fastener 10 abuts against the pressing section 201 of the clip 20. The pressing plates 104 of the fastener 10 respectively abut against top surfaces of the two central fins 302 of the heat sink 30. Thus, the fastener 10 is secured onto the heat sink 30, thereby preventing the clip 20 from falling out of the heat sink 30.

Figure 5:
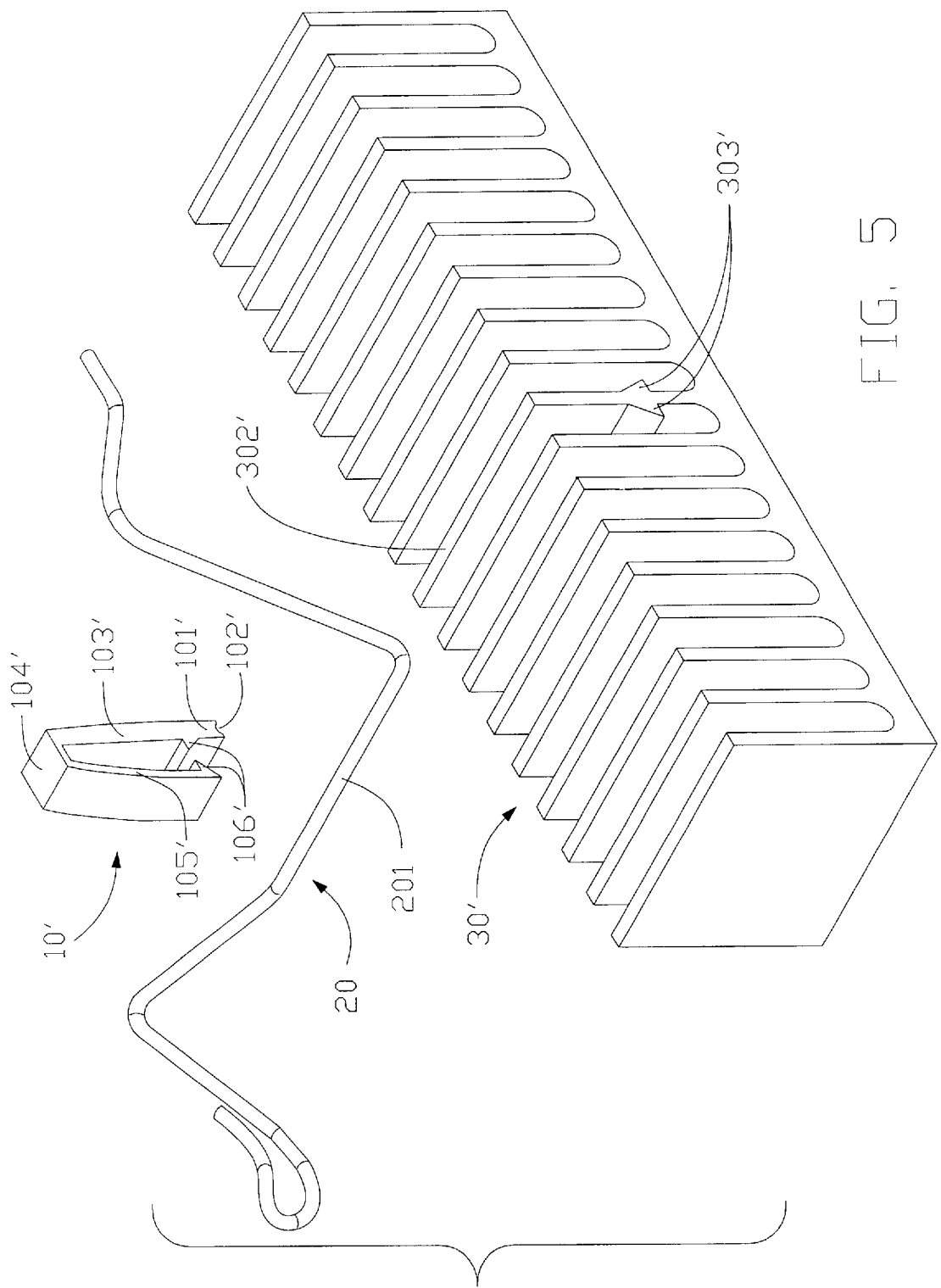
FIG. 5 is similar to FIG. 1, but showing an alternative embodiment of the present invention.

FIG. 5 shows a heat sink assembly in accordance with an alternative embodiment of the present invention. The heat sink assembly comprises a heat sink 30', a clip 20 and a fastener 10'. A pair of barbs 303' is respectively formed on opposite side surfaces of a central fin 302' of the heat sink 30'. The fastener 10' has a basal body 101', a side arm 103', a pressing plate 104', an arc-shaped locking arm 105', and a pair of catches 106'. An arc-shaped notch 102' is defined in a bottom surface of the basal body 101'. One of the catches 106' is inwardly formed at a distal end of the locking arm 105'. The other catch 106' is formed on a side wall of the side arm 103'. The two catches 106' are opposite each other and extend toward each other. In assembly, the pressing section 201 of the clip 20 is placed in a space (not labeled) of the heat sink 30' adjacent the central fin 302' having the barbs 303'. The fastener 10' is pressed onto the central fin 302'. The catches 106' of the fastener 10' snappingly engage with the barbs 303' of the heat sink 30'. The notch 102' of the fastener 10' abuts against the pressing section 201 of the clip 20. Thus the fastener 10' is secured onto the heat sink 30', thereby preventing the clip 20 from falling out of the heat sink 30'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:
   a heat sink having a base and a plurality of fins extending therefrom, at least one barb being formed on at least one fin;
   a clip having a pressing section for pressing the heat sink; and
   a fastener engaging with the at least one barb of the heat sink thereby securing the clip to the heat sink, the fastener comprising a basal body, at least one side arm extending upwardly from the body a distance corresponding to a height of the fins, at least one pressing plate extending horizontally from a top end of the at least one side arm, at least one locking arm depending from the at least one pressing plate, and at least one catch being inwardly formed on the at least one locking arm to engage with the at least one barb of the heat sink, a notch being defined in the basal body for facilitating abutting of the pressing section of the clip against the heat sink.

2. The heat sink assembly as described in claim 1, wherein each locking arm of the fastener is arc-shaped.

3. The heat sink assembly as described in claim 1, wherein the notch is arc-shaped and is defined in a bottom surface of the basal body.

4. The heat sink assembly as described in claim 1, wherein a pair of barbs is formed on outmost sides of two adjacent central fins of the heat sink.

5. The heat sink assembly as described in claim 4, wherein the fastener comprises two side arms, two pressing plates, two locking arms and two catches extending inwardly from distal ends of the locking arms for engaging with the barbs of the heat sink.

6. The heat sink assembly as described in claim 1, wherein a pair of barbs is symmetrically formed at opposite sides of a central fin of the heat sink.

7. The heat sink assembly as described in claim 6, wherein another catch is formed on a side of the side arm of the fastener generally opposite the corresponding catch of the locking arm, both catches engaging with the barbs of the central fin.

8. The heat sink assembly as described in claim 1, wherein the clip is made of a spring metal wire.

9. The heat sink assembly as described in claim 1, wherein the fastener is integrally made of plastic material.

10. A heat sink assembly comprising:
    a heat sink having a base and a plurality of fins projecting upwardly from the base;
    first engaging means being formed on at least one of the fins;
    a clip having a pressing section received in the heat sink and adapted for pressing the heat sink; and
    a fastener fixed to the heat sink for preventing the pressing section from disengaging from the heat sink said fastener having a receiving means for receiving the pressing section of the clip and abutting the pressing section against the base of the heat sink, and a second engaging means for engaging with the first engaging means thereby fixing the fastener to the heat sink.

11. The heat sink assembly as described in claim 10, wherein the receiving means is a notch defined in a bottom face of the fastener, the pressing section of the clip being fitted in the notch.

12. The heat sink assembly as described in claim 10, wherein the first engaging means is a protrusion formed on an outmost face of each of two adjacent fins.

13. The heat sink assembly as described in claim 10, wherein the first engaging means is a pair of protrusions formed on opposite faces of a fin.

14. The heat sink assembly as described in claim 12, wherein the pressing section of the clip is received in a space between the two adjacent fins on which the protrusions are formed.

15. The heat sink assembly as described in claim 13, wherein the pressing section of the clip is received in a space adjacent the fin on which the protrusions are formed.

\* \* \* \* \*